United States Patent
Buijsse

(10) Patent No.: US 7,067,820 B2
(45) Date of Patent: Jun. 27, 2006

(54) PARTICLE-OPTICAL APPARATUS WITH A PERMANENT-MAGNETIC LENS AND AN ELECTROSTATIC LENS

(75) Inventor: Bart Buijsse, Eindhoven (NL)

(73) Assignee: FEI Company, Hillsboro, OR (US)

( * ) Notice: Subject to any disclaimer, the term of this patent is extended or adjusted under 35 U.S.C. 154(b) by 119 days.

(21) Appl. No.: 10/829,002

(22) Filed: Apr. 21, 2004

(65) Prior Publication Data

US 2004/0211914 A1    Oct. 28, 2004

(30) Foreign Application Priority Data

Apr. 24, 2003    (NL) .................................. 1023260

(51) Int. Cl.
*H01J 49/06*    (2006.01)
(52) U.S. Cl. .................. 250/396 ML; 250/396 R; 250/398; 250/310
(58) Field of Classification Search ........ 250/396 ML, 250/396 R, 398, 310
See application file for complete search history.

(56) References Cited

U.S. PATENT DOCUMENTS

| | | | |
|---|---|---|---|
| 4,785,176 A | 11/1988 | Frosien et al. | |
| 4,806,766 A | 2/1989 | Chisholm | |
| 5,780,859 A | * 7/1998 | Feuerbaum et al. | .... 250/396 R |
| 6,057,553 A | 5/2000 | Khursheed et al. | |
| 6,307,312 B1 | 10/2001 | Tanaka | |
| 6,320,194 B1 | 11/2001 | Khursheed et al. | |
| 6,410,923 B1 | 6/2002 | Crewe | |
| 6,605,805 B1 * | 8/2003 | Chen | .......................... 250/310 |

* cited by examiner

*Primary Examiner*—Kiet T. Nguyen
(74) *Attorney, Agent, or Firm*—Michael O. Scheinberg

(57) ABSTRACT

Particle-optical apparatus are normally embodied with a magnetic or electrostatic lens so as to focus a beam 1 of charged particles onto a sample 8. It is desirable to be able to use these apparatus at different beam energies. It is, however, undesirable that the focus position 9 of the beam, as a result hereof, should shift with respect to the sample 8. Use of a permanent-magnetic material 6 in a magnetic lens has advantages as regards compact construction, but is normally avoided because it is not easily possible to adjust the lens power to match varying beam energies. The invention shows how it is possible to keep constant the focus position 9, independent of the energy of the particles in the beam 1, by combining a magnetic lens—that has been furnished with permanent-magnetic material—with an electrostatic lens. The electrostatic lens is embodied in that case as an accelerating lens.

23 Claims, 2 Drawing Sheets

PARTICLE-OPTICAL APPARATUS WITH A PERMANENT-MAGNETIC LENS AND AN ELECTROSTATIC LENS

FIELD OF THE INVENTION

The invention relates to a particle-optical apparatus provided with a focusing device having an optical axis for the purpose of focusing a beams of electrically charged particles upon a focus position, which focusing device comprises:
  a magnetic lens for producing a focusing magnetic field with the aid of magnetic pole pieces;
  an electrostatic lens for producing a focusing electric field, in which the beam undergoes an energy change,
whereby the focusing electric field is placed upstream with respect to a region situated between the focusing magnetic lens and the focus position.

BACKGROUND OF THE INVENTION

Such an apparatus is known from U.S. Pat. No. 4,785,176.

Such apparatus are known inter alia as Scanning Electron Microscope (SEM), Transmission Electron Microscope (MA) and Dual Beam Microscope (in which both an ion beam and an electron beam are employed). Apparatus as described above are used nowadays inter alia in areas of development, inspection and production of for example, the semiconductor industry. In this context, both, production means—such as lithographic. masks—and products and intermediate products—such as wafers—are inspected, repaired or manufactured in various phases using an electron beam and/or an ion beam. In irradiating a sample with charged particles, information can be obtained in various manners, such as with the aid of secondary particles and radiation excited in the sample. By collecting and processing this information with the aid of detectors, one can obtain insight into certain physical properties of the sample.

So as to prevent undesired electrical charging of, and/or damage to, the sample to be inspected, a certain landing energy will be required of the particles in the irradiating beam, dependent upon the nature of the sample. In the case of inspection using electrons, the desired landing energy typically lies in the range 0.5 to 5 keV.

Because of the constitution of the sample can vary from location to location, it may be desirable to adjust the landing energy commensurate with this varying constitution. In that context, it is desirable that the focus position of the beam does not shift with respect to the focusing device. This is of particular importance in a production environment, such as during the inspection of wafers, where adjustment of the focusing would disadvantageously influence the production throughput.

The magnetic lens in such apparatus is usually embodied with a coil that, with the aid of magnetic pole pieces, generates the focusing magnetic field. The current necessary for the generation of the magnetic field will cause heat dissipation in the coil. The physical dimensioning of the magnetic lens is determined to a great extent by the size of the coil and the space required for any cooling means that might be present. These cooling means, such as a cooling-water spiral, may be required so as to limit undesirable consequences of the dissipation, such as mechanical changes arising from temperature changes in the pole pieces.

In the field of particle-optical apparatus, there is a desire to miniaturize focusing devices as described here, for example so as to create space for detectors, or, with the aid of multiple beams of charged particles with attendant focusing devices, to concurrently obtain information from multiple locations on one or more samples.

In the US patent text referred to, a focusing device is described that consists of a magnetic lens for generating a focusing magnetic field with the aid of a coil and magnetic pole pieces, and an electrostatic lens for generating a focusing electric field, which electric field changes the energy of the beam. This known focusing device—by employing an electrostatic field that coincides wholly of partially with the magnetic field —strives to achieve a situation whereby the inevitable lens aberrations are smaller than the lens aberrations that can be achieved when using a magnetic lens alone. As regards the change in the energy of the beam, the US patent text referred to only states that the energy of the beam is decreased in the electrostatic field.

SUMMARY OF THE INVENTION

The invention seeks to provide an apparatus of the sort described in the opening paragraph, in which the focus position-independent of the landing energy—has a fixed location with respect to the focusing device, and is which the focusing device is suitable for miniaturization.

To that end, the apparatus according to the invention is characterized in that the magnetic lens is provided with permanent-magnetic maternal for generating the focusing magnetic field required for the lens action, and said energy change has the form of an energy increase.

The use of permanent magnetic materials leads, in the case of a given magnetic lens, to a constant magnetic field between the pole pieces, as a result of which different energies of the beam in the magnetic lens will result is different focal lengths of this lens.

The invention is based on the inventive insight that, if the energy change in the beam is an energy increase before or while the beam traverses the magnetic field of the magnetic lens, it becomes simple for the skilled artisan to construct the magnetic and electrostatic lens in such a manner that the changes in magnetic and electrostatic lens power compensate one another. To this end, it is essential that the energy change be an energy increase, seeing as, in the case of a decrease in energy in the beam, both the electrostatic lens and the magnetic lens increase in power, so that, in this latter case, compensation cannot be achieved.

It is worth noting that the described scenario in the US patent text referred to does not offer this possibility, seeing as, in that scenario, only a decrease of the energy of the beam is employed, for the purpose of achieving other goals as described therein.

In a preferential embodiment of the apparatus according to the invention, there is a region present around the optical axis in which region both a magnetic field and an electric field are present. Said measure implies that there is a region in which the electric field and the magnetic field overlap. As a result of this overlapping of the electric field and the magnetic field, a compact construction is made possible, born of the desire to miniaturize.

In another embodiment of the apparatus according to the invention, the sample-side pole piece of the magnetic lens is made of electrically conductive material, and it functions additionally as an electrode of the electrostatic lens. As a result of this integration of parts, a compact construction is made possible—born of the desire to miniaturize—and, in addition, the need to center the electrostatic electrode with respect to the magnetic pole piece becomes defunct.

In yet another embodiment of the apparatus according to the invention, the apparatus is provided with, adjustment mesas for rendering adjustable the focus position that is to be held constant by the apparatus during imaging. This measure makes it possible to adjust the focus position to make allowances for irregularities in the sample in a situation is which the macroscopic position of the sample remains constant;

BRIEF DESCRIPTION OF THE DRAWINGS

The invention will be elucidated on the basis of figures, in which identical reference numerals indicate corresponding elements. To this end:

FIG. 1b is a graphic depiction of the distribution of the axial electric and magnetic field strength and the energy of the beam as occurring in the particle-optical apparatus as depicted in FIG. 1a;

DETAILED DESCRIPTION OF THE DRAWINGS

Figure 1A:
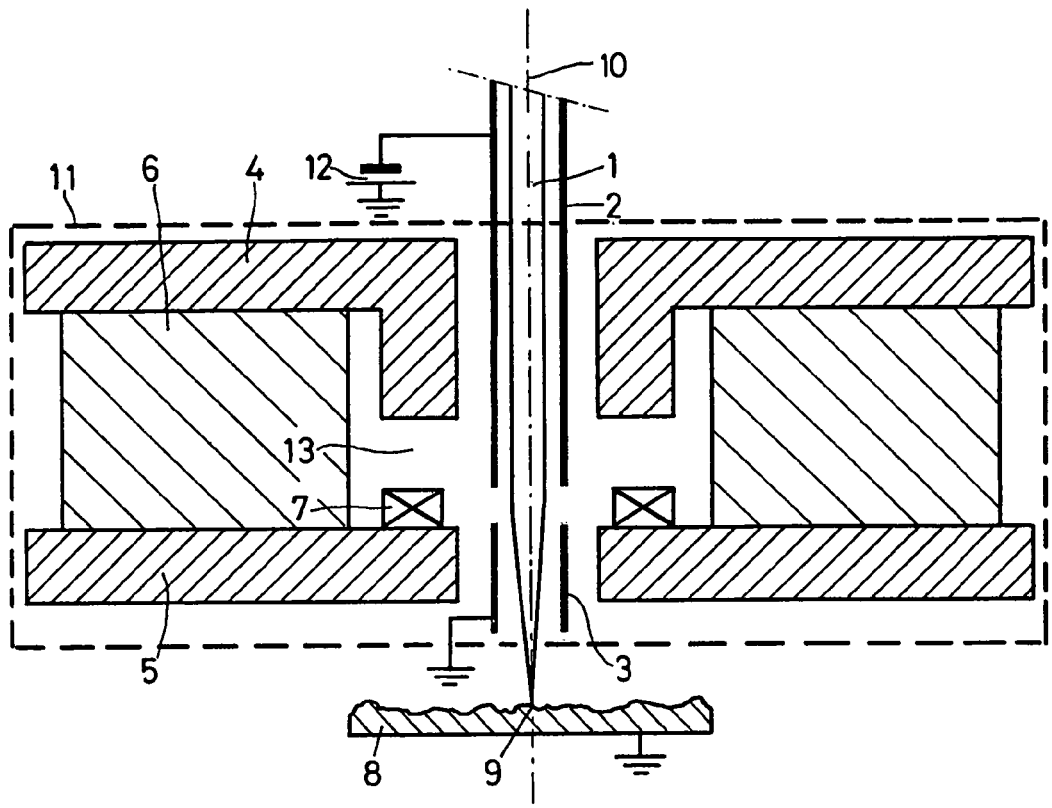
FIG. 1a is a schematic depiction of a focusing device for use in a particle-optical apparatus according to the invention.

FIG. 1a shows part of a particle-optical apparatus, such as a Scanning Electron Microscope (SEM), according to the invention, whereby a beam 1 of electrically charged particles, such as a beam of electrons, moves along an optical axis 10 of the apparatus.

This beam 1 is focused upon a focus position 9 by a focusing device 11. It is intended that the focus position 9 be located upon, a sample 8.

The focusing device 11 consists of a magnetic lens and an, electrostatic lens. The magnetic lens consists of two pole pieces 4 and 5 and between which permanent-magnetic material 6 is located, whereby the pole pieces are separated by a gap 13 extending around the optical axis 10. The electrostatic lens consists of two tube-like electrodes 2 and 3, located as a longitudinal extension of one another and around the optical axis 10, whereby electrode 3 is at earth potential and electrode 2 is connected to a power supply.

A coil 7 that is to be energized by an electrical current is located in the gap 13 between the magnetic pole pieces 4 and 5.

Between the electrodes 2 and 3, a voltage difference is applied with the aid of the power supply 12. This voltage difference causes a focusing electric field between the electrodes 2 and 3. As a result of this focusing electric field, the beam 1 is accelerated to a certain energy—hereinafter referred to as the landing energy—with which the beam 1 impinges upon the sample 8.

The magnetic pole pieces 4 and 5 guide a magnetic flux generated by permanent magnetic material 6 via the gap 13 to the region around the optical axis 10, where this flux causes a focusing magnetic field in the vicinity of the optical axis 10. To that end, when using the pole pieces 4 and 5 depicted in the figure, the permanent-magnetic material 6 has a magnetic direction parallel to the optical axis 10. The pole pieces 4 and 5 are dimensioned in such a manner that the scatter field due to the gap does not cause any significant magnetic field on, or in the vicinity of, the optical axis 10 exterior to the focusing device.

Figure 1B:
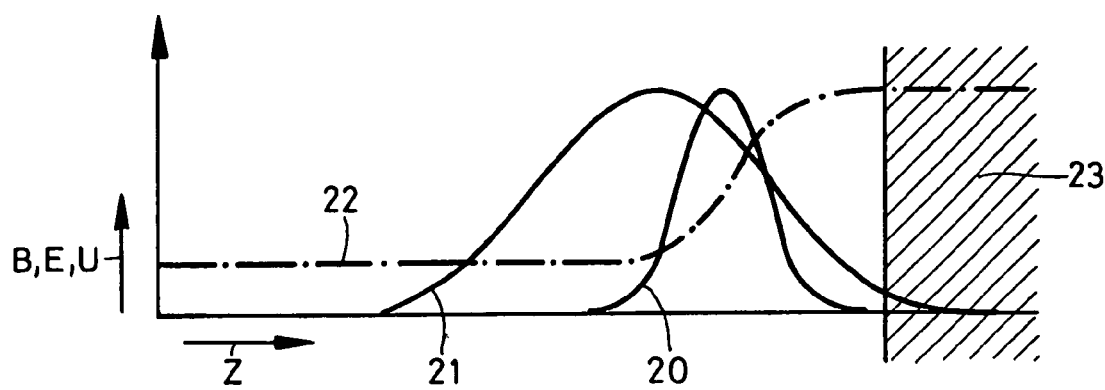

The additional magnetic field generated by coil 7 will, if desired, mildly change the focusing magnetic field already present on the optical axis 10. The focusing electric field E on the optical axis 10, as generated by the electrostatic lens, is graphically depicted in FIG. 1b by curve 20. The focusing magnetic field B on the optical axis, as generated by the magnetic lens, is graphically depicted in FIG. 1b by curve 21. The energy U of the electrons in the beam 1 on the optical axis 10 is depicted in FIG. 1b by curve 22. In this configuration, the focusing electric field 20 and the focusing magnetic field 21 are partially mutually overlapping. No electric (field is present in region 23 on the sample-side of the focusing magnetic field 21.

The focusing action of the focusing magnetic field 21 is determined inter alia by the energy 22 with which the electrons in the beam 1 traverse the focusing magnetic field 21.

When the electrons in the beam 1 have a high energy at the location of the focusing magnetic field 21, the focusing action will be less than the case whereby the electrons in the beam 1 have a low energy at that location.

Since the energy of the beam 1 is the focusing magnetic field 21 is influenced by the position and geometry of the focusing electric field 20, the choice of the location and geometry of the focusing electric field 20 with respect to the focusing magnetic field 21 can create a situation whereby changes in the magnetic and electrostatic lens powers compensate one another. As a result of this, as desired by the invention, the focus position 9 can be independent of the landing energy. Coil 7 can generate a magnetic field that can slightly change the focusing magnetic field 21 already present on the optical axis 10, for the purpose of adjusting the focus position 9 to make allowances for slight height variations of the sample 8, so that these slight height variations can be followed using the focused beam 1. The adjustment range of the focus position 9 is a slight fraction of the distance between pole piece 5 and the focus position 9. The magnetic field caused by the electrical coil 7 is thus a slight fraction of the focusing magnetic field 21 generated by the permanent-magnetic material 6. The current in the electrical coil 7 necessary to achieve the required adjustment range will this be only a fraction of the current that would be necessary if the permanent-magnetic material were not present. The heat dissipation problem associated with the use of a lens coil is thereby virtually eliminated.

Figure 2:
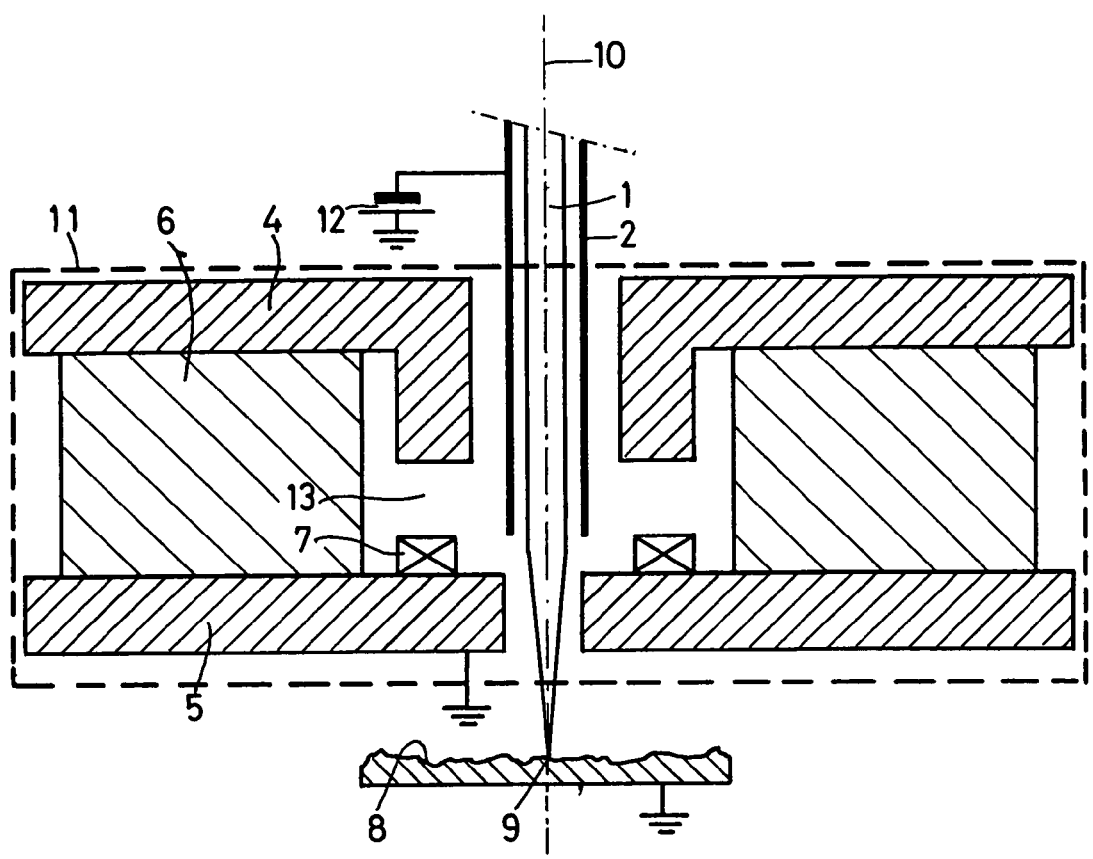
FIG. 2 is a schematic depiction, of a focusing device for use in a particle-optical apparatus according to the invention.

FIG. 2 shows an apparatus that is virtually identical to the apparatus according FIG. 1a, with the difference that electrode 3 is omitted in FIG. 2, and the function of this electrode 3 is assumed by pole piece 5, which is now electrically earthed. In this manner, the magnetic pole piece 5 also acts as an electrode of the electrostatic lens, and the focusing electric field is formed by the voltage difference between electrode 2 and pole piece 5. To that end, the magnetic pole piece 5 is made of electrically conductive material and is connected to earth potential. Simulations conducted on the basis of this embodiment have shown that, in this manner, a geometry can be found whereby—as desired by the invention—the focus position 9 can indeed be made independent of the landing energy.

The invention claimed is:

1. A particle-optical apparatus provided with a focusing device having an optical axis for the purpose of focusing a beam of electrically charged particles upon a focus position, which focusing device comprises:

a magnetic lens for producing a focusing magnetic field with the aid of magnetic pole pieces;

an electrostatic lens for producing a focusing electric field, in which the beam undergoes an energy change, whereby the focusing electric field is placed upstream with respect to a region situated between the focusing magnetic lens and the focus position, characterized in that
    the magnetic lens is provided with a permanent magnet for generating the focusing magnetic field required for the lens action, and;
    said energy change has the form of an energy increase.

2. A particle-optical apparatus according to claim 1, in which there is a region present around the optical axis in which region both the focusing magnetic field and the focusing electric field we present.

3. A particle-optical apparatus according to claim 2, in which the pole pieces of the magnetic lens include a sample-side pole piece that is made of electrically conductive material, and functions additionally as an electrode of the electrostatic lens.

4. A particle-optical apparatus according to claim 2, further comprising with an adjuster for rendering adjustable the focus position that is to be held constant by the apparatus during imaging.

5. A particle-optical apparatus according to claim 1, in which the pole pieces of the magnetic lens include a sample-side pole piece that is made of electrically conductive material, and functions additionally as an electrode of the electrostatic lens.

6. A particle-optical apparatus according to claim 5, further comprising an adjustor for rendering adjustable the focus position that is to be held constant by the apparatus during imaging.

7. A particle-optical apparatus according to claim 1, further comprising an adjuster for rendering adjustable the focus position that is to be held constant by the apparatus during imaging.

8. A particle-optical apparatus according to claim 1 in which the focusing device is configured for focusing a beam of electrons.

9. An electron microscope, comprising:
    an electron source; and
    a lens assembly in accordance with claim 8.

10. A lens assembly for a particle optical apparatus, comprising:
    a magnetic lens including a permanent magnet for producing a magnetic field for focusing a charged particle beam;
    an electrostatic lens, the electrostatic lens producing as electric field for focusing the charged particle beam and altering its energy;
    the magnetic lens end the electrostatic lens being configured such that the focal position of the lens assembly remains substantially constant as the landing energy of the charged particle beam is varied.

11. The lens assembly of claim 10 in which the electrostatic lens is configured to increase the enemy of the charged particle beam as it passes through the electrostatic lens.

12. The lens assembly of claim 10 in which at least a portion, of the magnetic field overlaps with at least a portion of the electric field in a region of space.

13. The lens assembly of claim 10 further comprising an adjustable magnetic lens for altering the focal position.

14. The lens assembly of claim 13 in which the adjustable magnetic lens includes an electromagnetic lens.

15. The lens assembly of claim 10 in which the lens assembly includes an optical axis and in which the electrostatic lens includes a tube through which the optical axis passes.

16. The lens assembly of claim 10 in which the electrostatic lens includes a first tube portion and a second tube portion, a difference in electrical potential between the first tube portion and the second tube portion tube providing an electrostatic field acting on the charged particle beam.

17. The lens assembly of claim 10 in which the magnetic lens includes two pole pieces.

18. The lens assembly of claim 17, in which at least one of the pole pieces functions as part of the electrostatic lens.

19. A method of making a charged particle beam system, comprising:
    providing a magnetic lens including a permanent magnet to produce a magnetic field for focusing a charged particle beam;
    providing an electrostatic lens, the electrostatic lens producing an electric field for focusing the charged particle beam and altering its energy;
    configuring the magnetic lens and the electrostatic lens such that the focal position of a lens assembly remains substantially constant as the landing energy of the charged particle beam is altered by the electrostatic lens.

20. The method of claim 19 in which
    providing a magnetic lens for focusing a charged particle beam includes providing a magnetic lens for focusing an electron beam; and
    providing an electrostatic lens for producing an electric field includes proving an electrostatic lens for focusing the electron beam and altering its energy.

21. A method of operating a charged particle beam system, comprising:
    directing a beam of charged particles through a magnetic focusing field originating from a permanent magnet;
    directing the beam of charged particles through a focusing electrostatic field, the electric field increasing the energy of the charged particles, the electrostatic field and the magnetic field overlapping, the fields being configured such that the focal plane of the charged particle beam system remains substantially unchanged as the energy of the charged particle beam is altered.

22. The method of claim 21 in which directing the beam of charged particles through a focusing electrostatic field includes directing the beam of charged particles through an electrostatic field that increases the energy of the charged particles.

23. The method of claim 21 in which directing a beam of charged particles through a magnetic focusing field originating from a permanent magnet includes directing a beam of electrons through the magnetic focusing field.

* * * * *